United States Patent [19]

Fulford, Jr. et al.

[11] Patent Number: 5,350,491

[45] Date of Patent: Sep. 27, 1994

[54] OXIDE REMOVAL METHOD FOR IMPROVEMENT OF SUBSEQUENTLY GROWN OXIDES FOR A TWIN-TUB CMOS PROCESS

[75] Inventors: Henry J. Fulford, Jr., Austin; Mark I. Gardner, Red Rock, both of Tex.

[73] Assignee: Advanced Micro Devices, Inc., Sunnyvale, Calif.

[21] Appl. No.: 947,313

[22] Filed: Sep. 18, 1992

[51] Int. Cl.$^5$ .................... H01L 21/00; H01L 21/02; B44C 1/22; C03C 15/00

[52] U.S. Cl. ..................... 156/657; 437/56; 430/313

[58] Field of Search .................. 156/657; 437/56, 57, 437/58; 430/313

[56] References Cited

U.S. PATENT DOCUMENTS

| | | | |
|---|---|---|---|
| 4,435,896 | 3/1984 | Parrillo et al. | 156/643 |
| 4,507,847 | 4/1985 | Sullivan | 437/57 |
| 4,525,920 | 7/1985 | Jacobs et al. | 437/57 |
| 4,558,508 | 12/1985 | Kinney et al. | 437/56 |
| 4,806,501 | 2/1989 | Baldi et al. | 437/56 |

FOREIGN PATENT DOCUMENTS 0061139 5/1981 Japan .................. 437/56

OTHER PUBLICATIONS

Ghandhi, VLSI Fabrication Principles, Wiley & Sons, 1983, pp. 421–430.
Elliot, Integrated Circuit Fabrication Technology, 1989, Mc Graw-Hill, pp. 59–61, 398, 399.
Sze, VLSI Technology, Mc Graw-Hill, 1988, p. 197.

Primary Examiner—R. Bruce Breneman
Assistant Examiner—B. Everhart
Attorney, Agent, or Firm—Skjerven, Morrill, MacPherson, Franklin & Friel

[57] ABSTRACT

A method is disclosed for removing oxide from the surface of a semiconductor body having a thick oxide and an adjoining thin oxide, without subjecting the surface to significant over-etching and thus avoiding degradation of the surface of the semiconductor body. A photoresist layer is first deposited covering the thin oxide. The thick oxide is then etched for a period of time so that a portion of the thick oxide remains, and has a thickness comparable to that of the thin oxide. The photoresist layer covering the thin oxide is next removed without appreciably etching either the remaining portion of the thick oxide or the thin oxide. Finally, the thin oxide and the remaining portion of the thick oxide are removed, without appreciably over-etching the surface of the semiconductor body.

16 Claims, 3 Drawing Sheets

OXIDE REMOVAL METHOD FOR IMPROVEMENT OF SUBSEQUENTLY GROWN OXIDES FOR A TWIN-TUB CMOS PROCESS

CROSS-REFERENCE TO RELATED APPLICATIONS

This patent document is related to copending, commonly assigned U.S. patent application Ser. No. 07/947,314, filed on even date herewith, which names Steven C. Hall, Mark I. Gardner and Henry Jim Fulford, Jr. as inventors and is entitled "An Oxide Removal Method for Improvement of Subsequently Grown Oxides", which application is incorporated herein by reference in its entirety.

BACKGROUND OF THE INVENTION

1. Field of the Invention

This invention relates to the fabrication of semiconductor devices, and more specifically, to the removal of oxides from the surface of a semiconductor substrate.

2. Description of Related Art

The importance of high quality oxides in the fabrication of semiconductor devices cannot be over-emphasized. Many broad categories of commercial devices, such as Electrically Erasable Programmable Read-Only Memories (EEPROMS), Dynamic Random Access Memories (DRAMs), and more recently, even high-speed basic logic functions, owe their commercialization to the reproducibility of high quality, very thin oxide layers.

FIGS. 1A, 1B, and 1C are cross sections of a portion of a twin-tub CMOS structure which illustrate several steps in the removal of the N-well oxide grown during the drive-in of an N-well implant. FIG. 1A shows the structure immediately after the N-well oxidation. In this example N-well oxide 14 is nominally 2700Å thick, having been grown to this thickness by a previous high temperature drive-in step for diffusing and activating the N-well implant (not shown) to form N-well 22 within bulk semiconductor 17. This specific thickness of 2700Å also provides a useful layer thickness to devise alignment structures for certain lithographic equipment. Nitride 10 covers the P-well region 19 (which will subsequently be implanted to form a P-well) to prevent the implantation of the n-type dopant into the P-well region 19, as well as to prevent the growth of any subsequent oxide over the P-well region 19 during the formation of oxide layer 14 over the N-well 22. Nitride layer 10 is typically 920Å thick.

The nitride layer 10 over the P-well region 19 is next removed with a wet phosphoric acid strip. Because of the extremely high selectivity of phosphoric acid between nitride and oxide, very little oxide is removed during this etch step. Barrier oxide 12 covers the P-well region 19 and provides an etch-stop barrier during this nitride removal process, as the phosphoric acid used to etch the nitride 10 would also etch the silicon substrate itself in the P-well region 19. This barrier oxide 12 is approximately 400Å thick. The structure remaining after nitride 10 removal is shown in FIG. 1B. As very little oxide was removed by the nitride etch step, the nominal thickness of barrier oxide 12 is still 400Å, and the nominal thickness of N-well oxide 14 remains at 2700Å.

A p-type dopant 11 (also shown in FIG. 1B) is next implanted through the barrier oxide 12 into the P-well region 19. N-well oxide 14 provides a suitably thick barrier which keeps the p-type dopant 11 from reaching the N-well 22. A twin-tub drive-in step follows and activates the p-type implant.

The next step is a 12 minute 10:1 HF dip etch which is required to remove the 2700Å of N-well oxide 14. The resulting structure following the HF dip etch is illustrated in FIG. 1C, which also shows P-well 20 as having been formed in the former P-well region 19. Next, typically the surface is subject to an RCA cleaning, and a thin oxide is subsequently grown over the exposed surface of the semiconductor material. This thin oxide may be a tunnel oxide or a gate oxide, for example.

SUMMARY OF THE INVENTION

We have found that an over-etch of the silicon surface at any process step prior to the growth of a thin oxide severely damages a silicon surface, thereby degrading the integrity of any subsequently grown thin oxide. Therefore, process flows that include an over-etch prior to a thin oxide formation do not achieve yields as high as might otherwise be achieved.

The present invention advantageously avoids excessively over-etching surface portions of a semiconductor body in the removal by etching of dielectrics of different thicknesses from these surface portions. The avoidance of over-etching facilitates the making of high quality thin oxides for numerous semiconductor fabrication purposes, including the making of tunnel oxides in the fabrication of EEPROM devices.

This advantage and other advantages are achieved in the present invention, which involves converting a thick dielectric into a dielectric of thickness comparable to a thin dielectric. As the converting step involves etching, a photoresist layer is provided over the thin dielectric. Once the converting step is complete, the photoresist layer is removed, and both the thin dielectric and converted dielectric are etched without appreciably over-etching the underlying semiconductor surfaces. In one embodiment, a photoresist layer is applied to cover and protect a barrier oxide from an oxide etch. A portion of an N-well oxide is next removed by performing an etch, so that the portion of N-well oxide remaining is of a thickness comparable to the thickness of the barrier oxide covering a P-well. The photoresist is then removed, with the barrier oxide protecting the silicon surface of the P-well, and the remaining portion of the N-well oxide protecting the silicon surface of the N-well. Lastly, an additional etch step in HF is performed to remove both the barrier oxide and the remaining portion of the N-well oxide.

DETAILED DESCRIPTIONS OF THE PREFERRED EMBODIMENTS

Figure 1A:
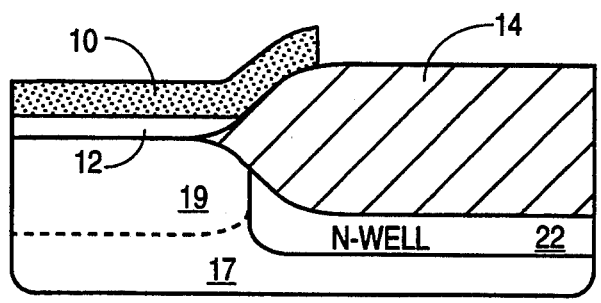
FIGS. 1A, 1B, and 1C are cross-sectional views illustrating a prior-art process flow for removing oxides of different thickness in a twin-tub CMOS process.
Figure 1B:
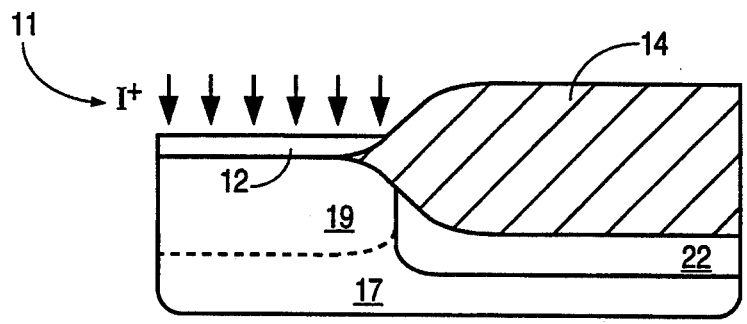
Figure 1C:
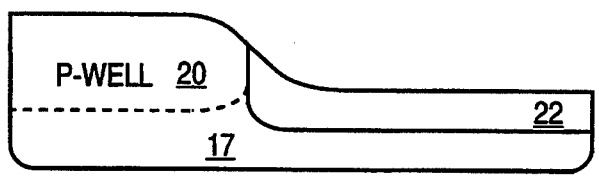

Referring to the oxide removal method illustrated by the cross-sections of FIGS. 1A, 1B, and 1C, since the etch rate of silicon dioxide in 10:1 HF is nominally 325Å/minute, the 2700Å thick N-well oxide 14 requires a 12 minute etch (which allows for manufacturing variations in exact thickness and etch rates). Since the barrier oxide 12 is only 400Å thick the silicon substrate over the P-well 20 unfortunately receives an over-etch of 10.75 minutes, representing an over-etch of 860%. We have found that a prolonged over-etch of the silicon surface at any process step prior to the growth of a thin oxide severely damages a silicon surface, thereby degrading the integrity of any subsequently grown thin oxide.

Figure 2:
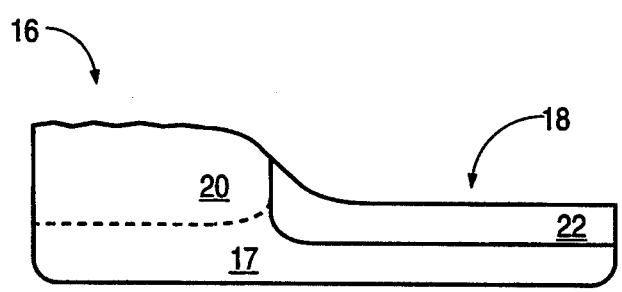
FIG. 2 is a cross-sectional view illustrating the actual surface resulting from the oxide etch step of the structure shown in FIG. 1B.

FIG. 2 shows the surfaces 16 (over the P-well 20) and 18 (over the N-well 22) actually resulting from the oxide etch of the structure shown in FIG. 1B. P-well surface 16 shows micro-roughness, due to the tremendous over-etch experienced by this surface 16. In contrast, N-well surface 18 is free from significant over-etch effects, since the etch was timed for complete removal of the N-well oxide 14, with only the customary nominal over-etch (to assure complete removal of the N-well oxide 14).

Excess time in an HF etch increases the micro-roughness and allows the P-well surface 16 to attract more particles and heavy metals. In subsequent process steps, thin gate oxides are grown from the P-well surface 16 to form N-channel transistors (not shown) and, for some product types, to form tunneling oxides (not shown) between N-type implanted regions (not shown) and a polysilicon layer (not shown). The presence of contaminant particles and heavy metals can cause defects in these oxide layers, which adversely affect the manufacturing yields.

Figure 3A:
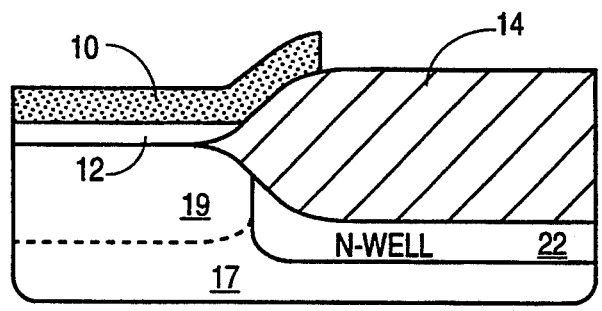
FIGS. 3A, 3B, 3C, 3D, 3E, and 3F are cross-sectional views illustrating a process flow, in accordance with the present invention, for removing oxides of different thickness in a twin-tub CMOS process.
Figure 3B:
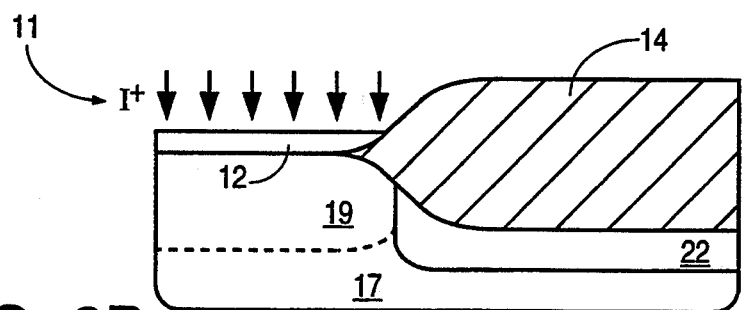
Figure 3C:
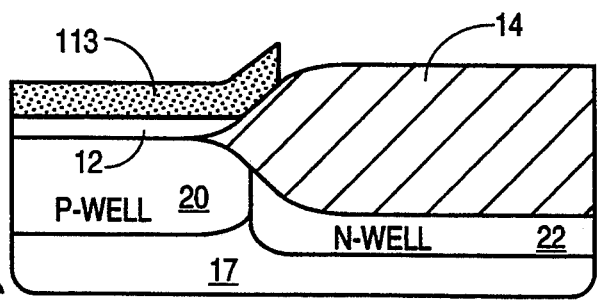
Figure 3D:
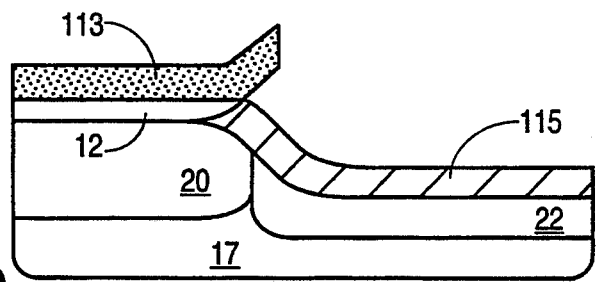
Figure 3E:
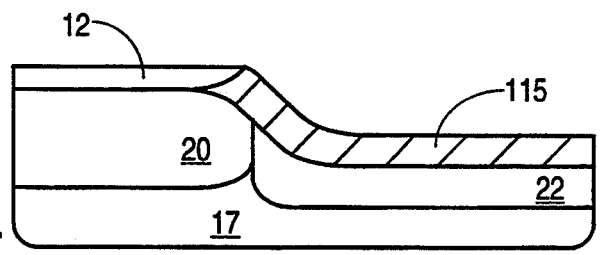
Figure 3F:
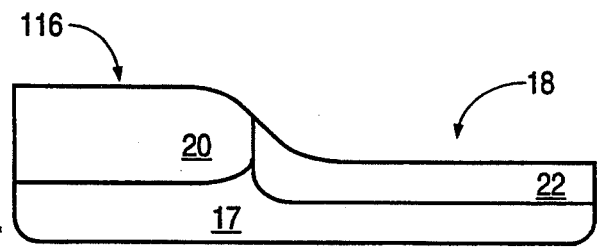

FIGS. 3A to 3F are cross-sections of a portion of a CMOS structure at various steps in a process which reduces substantially the amount of over-etch of the P-well surface, thereby improving the quality of subsequently grown thin oxides. The practical implication of the process used to form the structures of FIGS. 3D to 3F is the improvement of manufacturing yields and product quality.

FIG. 3A, which is identical to FIG. 1A, shows in cross-section a portion of a twin-tub CMOS structure immediately after N-well oxidation. N-well oxide 14 is nominally 2700Å thick, having been grown to this thickness by a previous high temperature drive-in step for diffusing and activating the N-well implant (not shown) to form N-well 22. Nitride 10 covers the P-well region 19 (which will subsequently be implanted to form a P-well) to prevent the implantation of the n-type dopant into the P-well region 19, as well as to prevent the growth of any subsequent oxide over the P-well region 19 during the N-well oxidation. Nitride layer 10 is typically 920Å thick.

Next, the nitride layer 10 over the P-well region 19 is removed with a wet phosphoric acid strip. Barrier oxide 12 covers the P-well region 19, and N-well oxide 14 covers the N-well 22, as both provide an etch stop during the nitride removal. Because of the extremely high selectivity of phosphoric acid between nitride and oxide, very little oxide is removed during this etch step. The resulting structure remaining after nitride 10 removal is shown in FIG. 3B. The nominal thickness of barrier oxide 12 is still 400Å, and the nominal thickness of N-well oxide 14 remains at 2700Å.

A p-type dopant 11 (also shown in FIG. 3B) is next implanted through the barrier oxide 12 into the P-well region 19. N-well oxide 14 provides a suitably thick barrier which keeps the p-type dopant 11 from reaching the N-well 22. A twin-tub drive-in step follows and activates the p-type implant.

A photoresist layer 113 is next applied and defined to cover the P-well region 19, and serves to protect the barrier oxide 12 from a subsequent oxide etch. The resulting structure is illustrated in FIG. 3C. Note that P-well 20 has been formed in the former P-well region 19.

Rather than next removing all the N-well oxide 14 as shown in FIG. 1C, only a portion of the N-well oxide 14 is now removed. This is accomplished by a 6 minute 10:1 HF dip etch that removes approximately 2000Å of the N-well oxide 14. Because photoresist layer 113 covers barrier oxide 12, no barrier oxide 12 is removed by this etch step. The resulting structure is shown in FIG. 3D. The remaining N-well oxide 115 is approximately 700Å thick.

Next, the photoresist layer 113 over the P-well 20 is removed and results in the structure shown in FIG. 3E. Barrier oxide 12 covers the P-well 20, and remaining N-well oxide 115 covers the N-well 22, as both provide an etch stop during the photoresist removal. Because oxides rarely react with common photoresist etchants, very little oxide is removed during this etch step. The nominal thickness of barrier oxide 12 is still 400Å, and the nominal thickness of remaining N-well oxide 115 is 700Å.

Lastly, a 3 minute 10:1 HF dip is performed to remove the barrier oxide 12 and the remaining N-well oxide 115. Since the thicknesses of the two oxides are comparable, an etch step sufficient to remove the thicker oxide will not subject the surface beneath the thinner oxide to substantial over-etching. The barrier oxide 12 is subjected to a total etch time of 3 minutes, rather than 12 minutes as in the process of FIGS. 1A to 1C, which reduces the over-etch from 860% to only 144%. Naturally, the over-etch time can be further reduced by reducing the thickness of remaining N-well oxide 115 to be closer to, or even less than, the thickness of barrier oxide 12.

FIG. 3F shows the resulting structure remaining after the above mentioned oxide etch step. P-well surface 116 shows much less micro-roughness, due to the significantly reduced amount of over-etch experienced by this surface. The structure shown in FIG. 3F typically is subject to an RCA clean prior to subsequent oxide growth. If care is taken, the RCA clean will not appreciably damage the P-well surface 116 and N-well surface 18. Suitable RCA clean techniques are described in "Dependence of Thin Oxide Quality on Surface Micro-Roughness" by T. Ohmi, et. al., IEEE Transactions on Electron Devices, Vol. 39, Number 3, March 1992.

Note that the photoresist layer 113 is shown in FIG. 3C as extending a short distance onto the N-well oxide 14. The purpose of the extension is to shield a portion of the tapered region of the oxide 14 over the transition surface region between surfaces 116 and 18 so as to achieve a generally uniform thickness of the oxide 115, as shown in FIG. 3D. In practice, because of process alignment tolerance, the edge of the photoresist layer 113 may vary slightly from the position shown in FIG. 3C, which may result in either a small residual oxide on the transition surface region, or an over-etch of the transition surface region. For integrated circuits in which a residual oxide is undesirable, the extension of the photoresist layer 113 may be made smaller to ensure that the surface in the transition surface region is always over-etched. In either case, any adverse effects from the over-etched transition surface region can be accommodated by appropriately setting the active source/drain distance from the transition surface region, in the design rules.

Generally, in structures having oxides of different thickness over substrate regions in which gate or tunnel oxides are to be formed, the thicker oxides are converted to oxides having thicknesses comparable to the thickness of the thin oxide. Preferably, none of these surface regions is subject to greater than about a two minute over-etch time. In the process of FIG. 3 since barrier oxide 12 typically is in the range of 150–500Å thick and N-well oxide 14 typically is as thick as 6000Å, conversion of the oxide 14 to an oxide 115 of, for example, less than about 1000Å allows for a suitably limited over-etch in the subsequent oxide etch step.

These improvements represent a startling cost reduction in the production of devices using thin oxides. The process flow of FIGS. 3A to 3F yields a higher quality oxide, at lower cost, while producing no known unwanted side effects in N-channel and P-channel transistor characteristics.

While the above descriptions reference an EEPROM technology fabricated in a twin-tub CMOS technology, the teachings of this disclosure can be advantageously applied to other semiconductor process technologies, particularly processes derived from early LOCOS technology which uses nitride layers to selectively mask oxidation.

While the invention has been described with respect to the embodiments set forth above, the invention is not necessarily limited to these embodiments. For example, the invention is not necessarily limited to any particular transistor process technology, or to any particular layer thickness or composition. Moreover, variations in certain of the process steps can be practiced. For example, rather than stopping the etching of the thick N-well oxide 14 to achieve the remaining N-well oxide feature 115, conversion of the thick N-well oxide 14 may be achieved by removing the oxide 14 entirely and growing a new oxide to the thickness of the N-well oxide feature 115. Accordingly, other embodiments, variations, and improvements not described herein are not necessarily excluded from the scope of the invention, which is defined by the following claims.

We claim:

1. A method for removing a dielectric from the surface of a semiconductor body, wherein the dielectric comprises a first dielectric and a second dielectric in respective first and second regions of the semiconductor body, and wherein the second dielectric is thicker than the first dielectric, comprising the steps of:
providing a photoresist layer covering the first dielectric;
converting with use of a dielectric etchant the second dielectric into a third dielectric having a thickness comparable to the thickness of the first dielectric, wherein the photoresist layer masks the first dielectric from the dielectric etchant;
subsequent to the dielectric converting step, removing the photoresist layer; and
subsequent to the photoresist layer removing step, commonly etching the first and third dielectrics down to respective first and second surfaces of the semiconductor body, wherein neither the first surface nor the second surface is appreciably degraded due to over-etching.

2. A method as in claim 1 wherein the dielectric comprises an oxide.

3. A method as in claim 1 wherein the dielectric converting step comprises forming the third dielectric by etching the second dielectric so that a portion remains of a thickness comparable to the thickness of the first dielectric.

4. A method as in claim 1 wherein the dielectric converting step comprises forming the third dielectric by removing the second dielectric and then regrowing an oxide over the second region to a thickness comparable to the thickness of the first dielectric.

5. A method for removing oxide from the surface of a semiconductor body having a thick oxide and an adjoining thin oxide prior to forming a gate oxide for a field effect device, comprising the steps of:
depositing a photoresist layer;
subsequent to the photoresist layer depositing step, defining the photoresist layer so as to expose the thick oxide while still covering the thin oxide;
subsequent to the photoresist layer defining step, etching the thick oxide so that a portion of the thick oxide remains, and has a thickness comparable to that of the thin oxide;
subsequent to the thick oxide etching step, removing the photoresist layer covering the thin oxide; and
subsequent to the photoresist layer removing step, etching the thin oxide and the remaining portion of the thick oxide without appreciably over-etching the surface of the semiconductor body.

6. A method as in claim 5 wherein the thick oxide covers an N-well region, the N-well region having been formed prior to the formation of the thick oxide.

7. A method as in claim 6 wherein the thin oxide covers a P-well region.

8. A method as in claim 7 wherein the thickness of the thick oxide, prior to the thick oxide etching step, is nominally 2700Å.

9. A method as in claim 8 wherein the thickness of the thin oxide is nominally 400Å, and wherein the thickness of the remaining portion of the thick oxide is nominally 700Å.

10. A method as in claim 9 wherein the thick oxide etching step comprises etching the thick oxide for 6 minutes using 10:1 HF, and wherein the step of etching the thin oxide and the remaining portion of the thick oxide comprises etching both the thin oxide and the remaining portion of the thick oxide for 3 minutes using 10:1 HF.

11. A method for avoiding degradation of a surface of a semiconductor body having a thick oxide layer and an adjoining photoresist-masked first thin oxide layer, comprising the steps of:
converting the thick oxide into a second thin oxide;
removing the photoresist subsequent to the thick oxide converting step; and
etching the first and second thin oxides subsequent to the photoresist removing step, wherein the thickness of the first and second thin oxides and the duration of etching are such that appreciable degradation of the surface of the semiconductor body does not occur.

12. A method as in claim 11 wherein the converting step comprises forming the second thin oxide by etching the thick oxide so that a portion of the thick oxide remains.

13. A method as in claim 11 wherein the converting step comprises forming the second thin oxide by etching the thick oxide and then regrowing an oxide.

14. A method for avoiding degradation of a surface of a semiconductor body having a thick oxide layer and an adjoining photoresist-masked first thin oxide layer, comprising the steps of:

converting the thick oxide into a second thin oxide;

removing the photoresist subsequent to the thick oxide converting step; and etching the first and second thin oxides subsequent to the photoresist removing step, wherein the thickness of the first and second thin oxides and the duration of etching are such that the surface of the semiconductor body remains free of appreciable surface microroughness.

15. A method as in claim 14 wherein the converting step comprises forming the second thin oxide by etching the thick oxide so that a portion of the thick oxide remains.

16. A method as in claim 14 wherein the converting step comprises forming the second thin oxide by etching the thick oxide and then regrowing an oxide.

* * * * *